US010163978B2

(12) United States Patent
Sciarrillo et al.

(10) Patent No.: US 10,163,978 B2
(45) Date of Patent: Dec. 25, 2018

(54) MEMORY CELL WITH INDEPENDENTLY-SIZED ELEMENTS

(71) Applicant: Micron Technology, Inc., Boise, ID (US)

(72) Inventors: Samuele Sciarrillo, Lomagna (IT); Marcello Ravasio, Olgiate Molgora (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/479,403

(22) Filed: Apr. 5, 2017

(65) Prior Publication Data
US 2017/0207273 A1 Jul. 20, 2017

Related U.S. Application Data

(62) Division of application No. 14/867,185, filed on Sep. 28, 2015, now Pat. No. 9,640,588, which is a division of application No. 13/952,357, filed on Jul. 26, 2013.

(51) Int. Cl.
H01L 27/24 (2006.01)
H01L 45/00 (2006.01)
H01L 27/22 (2006.01)

(52) U.S. Cl.
CPC ........ H01L 27/2427 (2013.01); H01L 27/224 (2013.01); H01L 27/226 (2013.01); H01L 27/228 (2013.01); H01L 27/2409 (2013.01); H01L 27/2436 (2013.01); H01L 27/2445 (2013.01); H01L 27/2463 (2013.01); H01L 27/2481 (2013.01); H01L 45/04 (2013.01); H01L 45/06 (2013.01); H01L 45/065 (2013.01); H01L 45/1233 (2013.01); H01L 45/1253 (2013.01); H01L 45/14 (2013.01); H01L 45/141 (2013.01); H01L 45/144 (2013.01); H01L 45/148 (2013.01); H01L 45/1675 (2013.01)

(58) Field of Classification Search
None
See application file for complete search history.

(56) References Cited

U.S. PATENT DOCUMENTS 7,442,603 B2 10/2008 Lai et al.
7,875,493 B2 1/2011 Lung
(Continued)

FOREIGN PATENT DOCUMENTS

CN 1774807 A 5/2006
CN 102270739 A 12/2011
(Continued)

OTHER PUBLICATIONS

Notice of Preliminary Rejection from related Korean patent application No. 10-2016-7004710, dated Jul. 17, 2017, 10 pp.
(Continued)

Primary Examiner — Andres Munoz
(74) Attorney, Agent, or Firm — Brooks, Cameron & Huebsch, PLLC

(57) ABSTRACT

Memory cell architectures and methods of forming the same are provided. An example memory cell can include a switch element and a memory element formed in series with the switch element. A smallest lateral dimension of the switch element is different than a smallest lateral dimension of the memory element.

11 Claims, 6 Drawing Sheets

(56) References Cited

U.S. PATENT DOCUMENTS

| | | |
|---|---|---|
| 8,063,394 B2 | 11/2011 | Andres et al. |
| 8,097,870 B2 | 1/2012 | Hutchinson et al. |
| 8,274,067 B2 | 9/2012 | Ahn et al. |
| 8,404,514 B2 | 3/2013 | Lee et al. |
| 8,405,062 B2 | 3/2013 | Yin et al. |
| 2006/0157683 A1 | 7/2006 | Scheuerlein |
| 2007/0158698 A1 | 7/2007 | Dennison et al. |
| 2008/0111120 A1* | 5/2008 | Lee ............... H01L 27/2409 257/2 |
| 2008/0191188 A1* | 8/2008 | Jeong ............... G11C 11/56 257/4 |
| 2009/0130797 A1* | 5/2009 | Lee ............... H01L 27/2409 438/102 |
| 2010/0038623 A1 | 2/2010 | Xu et al. |
| 2010/0237320 A1* | 9/2010 | Nagashima ........ H01L 27/101 257/5 |
| 2010/0238704 A1* | 9/2010 | Komura ............ G11C 13/0004 365/148 |
| 2011/0073830 A1 | 3/2011 | Kim et al. |
| 2011/0095257 A1 | 4/2011 | Xu et al. |
| 2011/0147691 A1 | 6/2011 | Yasutake |
| 2011/0147695 A1 | 6/2011 | Lee et al. |
| 2011/0186797 A1 | 8/2011 | Herner |
| 2012/0025162 A1 | 2/2012 | Shin et al. |
| 2012/0080725 A1 | 4/2012 | Manos et al. |
| 2013/0099190 A1* | 4/2013 | Oh ............... H01L 27/2409 257/4 |
| 2013/0187114 A1 | 7/2013 | Kai et al. |
| 2014/0158975 A1 | 6/2014 | Herner |

FOREIGN PATENT DOCUMENTS

| | | |
|---|---|---|
| KR | 10-2008-0010621 A | 1/2008 |
| TW | 201019516 A | 5/2010 |
| TW | 201203639 A | 1/2012 |
| WO | 2004100267 A | 11/2004 |
| WO | 2004100267 A1 | 11/2004 |

OTHER PUBLICATIONS

International Search Report and Written Opinion from related international application No. PCT/US2014/047939, dated Nov. 6, 2014, 15 pp.

Office Action from related Taiwanese patent application No. 103125594, dated Dec. 31, 2015, 12 pp.

Extended Search Report from related European patent application No. 14828854.1, dated May 19, 2017, 7 pp.

Notice of Final Rejection from related Korean patent application No. 10-2016-7004710, dated Jan. 25, 2018, 8 pp.

Office Action from related Chinese patent application No. 201480050146.5 dated Jan. 29, 2018, 17 pp.

Communication pursuant to Article 94(3) EPC from related European patent application No. 14828854.1, dated Feb. 5, 2018, 3 pp.

Communication pursuant to Article 94(3) EPC, from related European patent application No. 14828854.1, dated Sep. 20, 2018, 4 pp.

Office Action from related Chinese patent application No. 201480050146.5, dated Sep. 29, 2018, 15 pp.

* cited by examiner

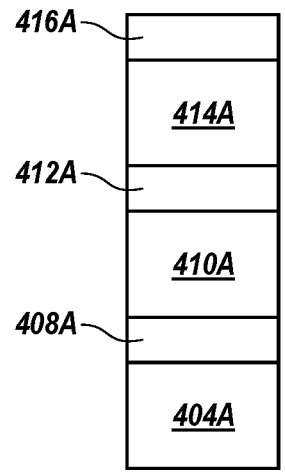 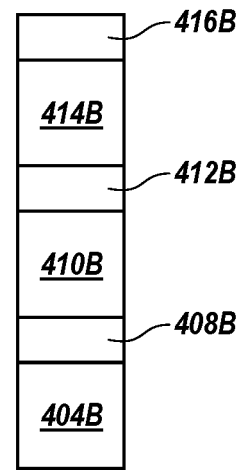
*Fig. 4A*  *Fig. 4B*
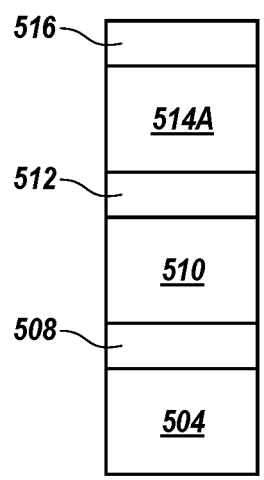 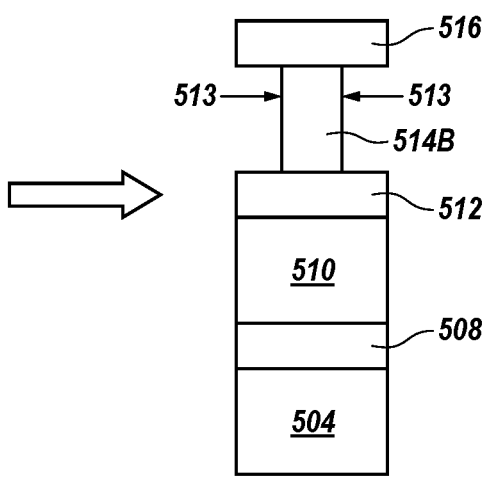
*Fig. 5A*  *Fig. 5B*

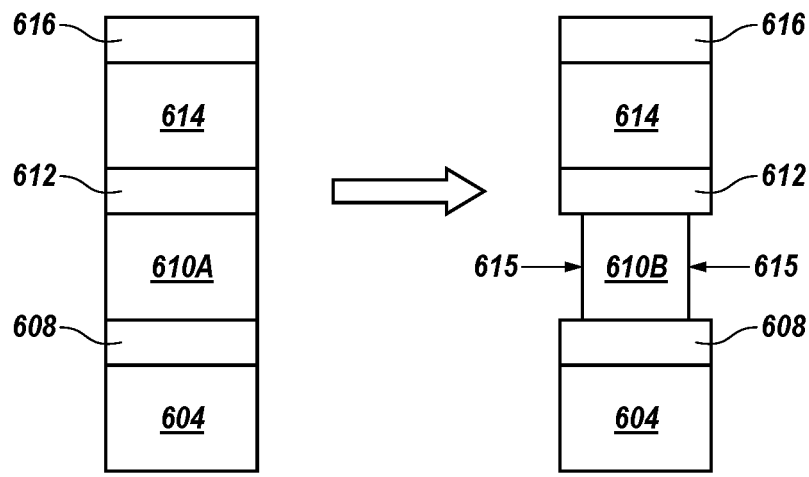
*Fig. 6A*     *Fig. 6B*
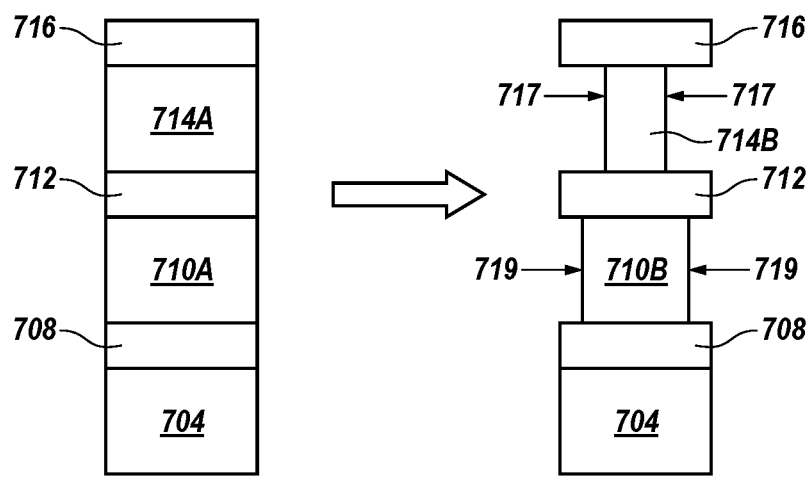
*Fig. 7A*     *Fig. 7B*

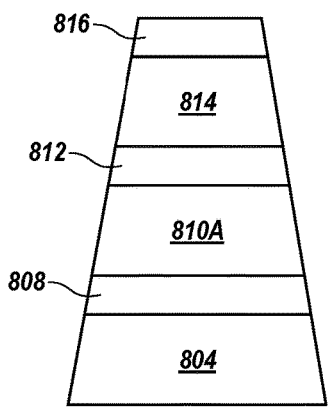 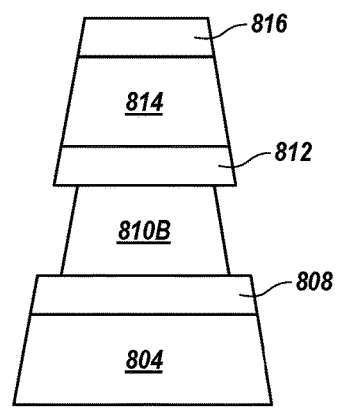
*Fig. 8A*    *Fig. 8B*

US 10,163,978 B2

MEMORY CELL WITH INDEPENDENTLY-SIZED ELEMENTS

PRIORITY INFORMATION

This application is a Divisional of U.S. application Ser. No. 14/867,185 filed Sep. 28, 2015, which is a Divisional of U.S. application Ser. No. 13/952,357 filed Jul. 26, 2013, the specifications of which are incorporated herein by reference.

TECHNICAL FIELD

The present disclosure relates generally to semiconductor devices, and more particularly to memory cell architectures and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change material (PCM) memory, programmable conductor memory, and resistive random access memory (RRAM), among others.

Non-volatile memory are utilized as memory devices for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Constant challenges related to memory device fabrication are to decrease the size of a memory device, increase the storage density of a memory device, reduce power consumption, and/or limit memory device cost. Some memory devices include memory cells arranged in a two dimensional array, in which memory cells are all arranged in a same plane. In contrast, various memory devices include memory cells arranged into a three dimensional (3D) array having multiple levels of memory cells.

BRIEF DESCRIPTION OF THE DRAWINGS

FIGS. 4A and 4B illustrate cross-sectional views in a same cross section of different sized stacks corresponding to a memory cell in accordance with a number of embodiments of the present disclosure.

FIGS. 5A and 5B illustrate cross-sectional views of stacks corresponding to a memory cell having different sized memory elements in accordance with a number of embodiments of the present disclosure.

FIGS. 6A and 6B illustrate cross-sectional views of stacks corresponding to a memory cell having different sized switch elements in accordance with a number of embodiments of the present disclosure.

FIGS. 7A and 7B illustrate cross-sectional views of stacks corresponding to a memory cell having different sized memory and switch elements in accordance with a number of embodiments of the present disclosure.

FIGS. 8A and 8B illustrate cross-sectional views of stacks corresponding to a memory cell having non-vertical stack wall and different sized switch elements in accordance with a number of embodiments of the present disclosure.

DETAILED DESCRIPTION

Figure 1:
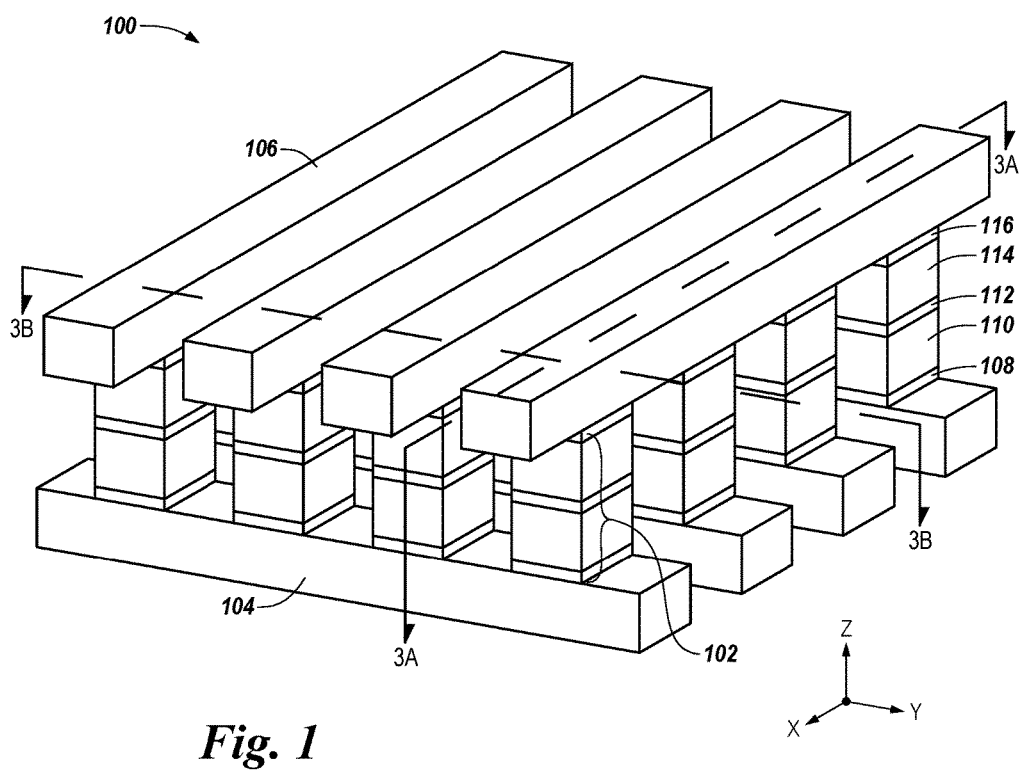
FIG. 1 is a perspective view of a portion of a memory array in accordance with a number of embodiments of the present disclosure.

Memory cell architectures and methods of forming the same are provided. An example memory cell can include a switch element and a memory element formed in series with the switch element. A smallest lateral dimension of the switch element is different than a smallest lateral dimension of the memory element.

Embodiments of the present disclosure implement a memory cell in a cross point memory array in which the switch element dimensions are independent from the memory element dimensions. Size independence between the switch element and the memory element allows for an unlimited number of combinations of memory element size relative to select element size, which in turn facilitates addressing specific electrical properties associated with particular cross point array applications. With the ability to independently size the switch element and the memory element in a same stack of materials forming a memory cell, e.g., using phase change material (PCM), in a cross point array, the current density for the memory element can be different than the current density for the switch element. For example, in a phase change mechanism in the memory element can be improved without resulting in undue switching stress on the switch element.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 306 in FIG. 3A. Also, as used herein, "a number of" a particular element and/or feature can refer to one or more of such elements and/or features.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

FIG. 1 is a perspective view of a portion of a memory array 100 in accordance with a number of embodiments of the present disclosure. In the example shown in FIG. 1, memory array 100 is a cross point memory/switch memory array, e.g., a phase change memory array. However, embodiments of the present disclosure are not so limited. Embodiments of the present disclosure can comprise a two dimensional (2D) cross point memory array, or a three dimensional (3D) cross point memory array with more decks between word lines and bit lines.

Array 100 can be a cross-point array having memory cells 102 located at the intersections of a number of conductive lines, e.g., access lines 104, which may be referred to herein as word lines, and a number of conductive lines, e.g., data/sense lines 106, which may be referred to herein as bit lines. As illustrated in FIG. 1, word lines 104 can be parallel or substantially parallel to each other and can be orthogonal to bit lines 106, which can be parallel or substantially parallel to each other. However, embodiments are not so limited. Word lines 104 and/or bit lines 106 can be a conductive material such as tungsten, copper, titanium, aluminum, and/or other metals, for example. However, embodiments are not so limited. In a number of embodiments, array 100 can be a portion, e.g., a level, of a three-dimensional array, e.g., a multi-level array, (described further with respect to FIG. 2) in which other arrays similar to array 100 are at different levels, for example above and/or below array 100.

Each memory cell 102 can include a memory element 114, e.g., storage element, coupled in series with a respective switch element 110, e.g., selector device, and/or access device. The memory cell can have a number of electrodes adjacent the memory element 114 and switch element 110, including a first, e.g., top, electrode, second, e.g., middle, electrode, and/or third, e.g., bottom, electrode. The memory element 114 can be, for example, a resistive memory element. The memory element 114 can be formed between a pair of electrodes, e.g., first electrode 116 and second electrode 112. The memory element can be comprised of a resistance variable material such as a phase change memory (PCM) material, for example. As an example, the PCM material can be a chalcogenide alloy such as a Germanium-Antimony-Tellurium (GST) material, e.g., Ge–Sb–Te materials such as $Ge_2Sb_2Te_5$, $Ge_1Sb_2Te_4$, $Ge_1Sb_4Te_7$, $Ge_8Sb_5Te_8$, $Ge_4Sb_4Te_7$, etc., or an indium(In)-antimony (Sb)-tellurium(Te) (IST) material, e.g., $In_2Sb_2Te_5$, $In_1Sb_2Te_4$, $In_1Sb_4Te_7$, etc., among other phase change memory materials. The hyphenated chemical composition notation, as used herein, indicates the elements included in a particular mixture or compound, and is intended to represent all stoichiometries involving the indicated elements. Other phase change memory materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. However, embodiments of the present disclosure are not limited to a particular type of PCM material. Further, embodiments are not limited to memory elements comprising PCM materials. For instance, the memory elements can comprise a number of resistance variable materials such as binary metal oxides, colossal magnetoresistive materials, and/or various polymer-based resistive variable materials, among others.

For simplicity, FIG. 1 shows the memory element 114 and the switch element 110 having similar dimensions. However, as is discussed below, a memory cell 102 can be formed with a memory element 114 having different dimension(s), e.g., critical dimension, cross-sectional area, etc., than the switch element 110.

The switch element 110 can be a two terminal device such as a diode, an ovonic threshold switch (OTS), or an ovonic memory switch (OMS). However, embodiments of the present disclosure are not limited to a particular type of switch element 110. For example, the switch element 110 can be a field effect transistor (FET), a bipolar junction transistor (BJT), or a diode, among other types of selector devices. The switch element 110 can be formed between a pair of electrodes, e.g., the second electrode and a third electrode 112 and 108. Although FIG. 1 illustrates a configuration having the memory element 114 formed over the switch element 110, embodiments of the present disclosure are not so limited. According to various embodiments of the present disclosure the switch element 110 can be formed over the memory element 114, for example.

Electrodes 108, 112, and/or 116 can comprise materials such as Ti, Ta, W, Al, Cr, Zr, Nb, Mo, Hf, B, C, conductive nitrides of the aforementioned materials, e.g., TiN, TaN, WN, CN, etc.), and/or combinations thereof.

In a number of embodiments, the switch elements 110 corresponding to memory cells 102 can be OTS's having a chalcogenide selector device material. In such embodiments, the chalcogenide material of the switch element 110 may not actively change phase, e.g., between amorphous and crystalline, such as a chalcogenide resistance variable material of the memory element. Instead, the chalcogenide material of the switch element can change between an "on" and "off" state depending on the voltage potential applied across memory cell 102. For example, the "state" of the OTS can change when a current through the OTS exceeds a threshold current or a voltage across the OTS exceeds a threshold voltage. Once the threshold current or voltage is reached, an on state can be triggered and the OTS can be in a conductive state. In this example, if the current or voltage potential drops below a threshold value, the OTS can return to a non-conductive state.

In a number of embodiments, the memory element 114 can comprise one or more of the same material(s) as the switch element 110. However, embodiments are not so limited. For example, memory element 114 and switch element 110 can comprise different materials.

Memory cells 102 can be programmed to a target data state, e.g., corresponding to a particular resistance state, by applying sources of an electrical field or energy, such as positive or negative electrical pulses, to the cells, e.g., to the storage element of the cells, for a particular duration. The electrical pulses can be, for example, positive or negative voltage or current pulses.

Figure 2:
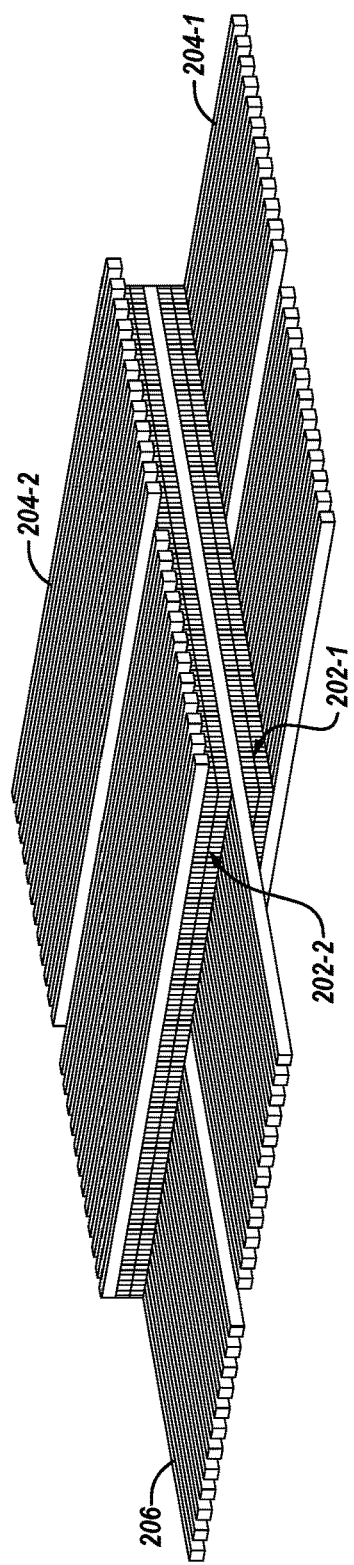
FIG. 2 illustrates a three dimensional memory array in accordance with a number of embodiments of the present disclosure.

FIG. 2 illustrates a three dimensional (3D) memory array in accordance with a number of embodiments of the present disclosure. The 3D memory array comprises a plurality of memory cells 202-1, 202-2, e.g., memory element in series with a switch element as described with respect to FIG. 1. FIG. 2 shows a first memory array comprising memory cells 202-1 formed between word lines 204-1 and bits lines 206, and a second memory array comprising memory cells 202-2 formed between word lines 204-2 and bits lines 206. That is, the first memory array formed below bit lines 206 and the second memory array formed above bit lines 206 share common bit lines 206 therebetween.

FIG. 2 is a simplified diagram that does not precisely reflect the three dimensional physical dimensions of the various features illustrated, including the exact proximity of features to one another. FIG. 2 should not be considered as to be representative of the precise topological positioning of the various elements. Rather, FIG. 2 provides an overview of the electrical scheme for a 3D memory array, and the approximate relative arrangement of the various features. Although FIG. 2 shows a 3D array comprising 2 memory arrays, embodiments of the present invention are not so limited, and can include additional memory array(s) arranged into a number of levels.

Figure 3A:
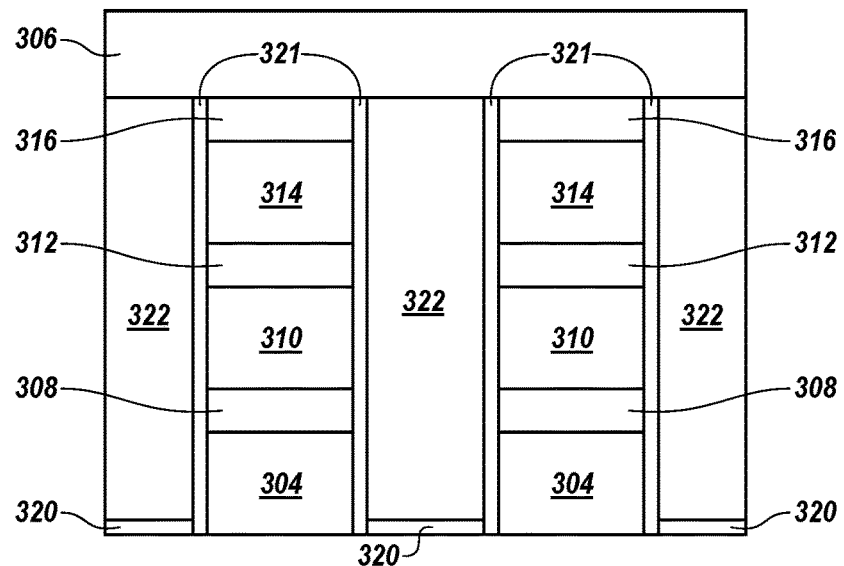
FIGS. 3A and 3B illustrate cross-sectional views of memory cells in perpendicular directions in accordance with a number of embodiments of the present disclosure.
Figure 3B:
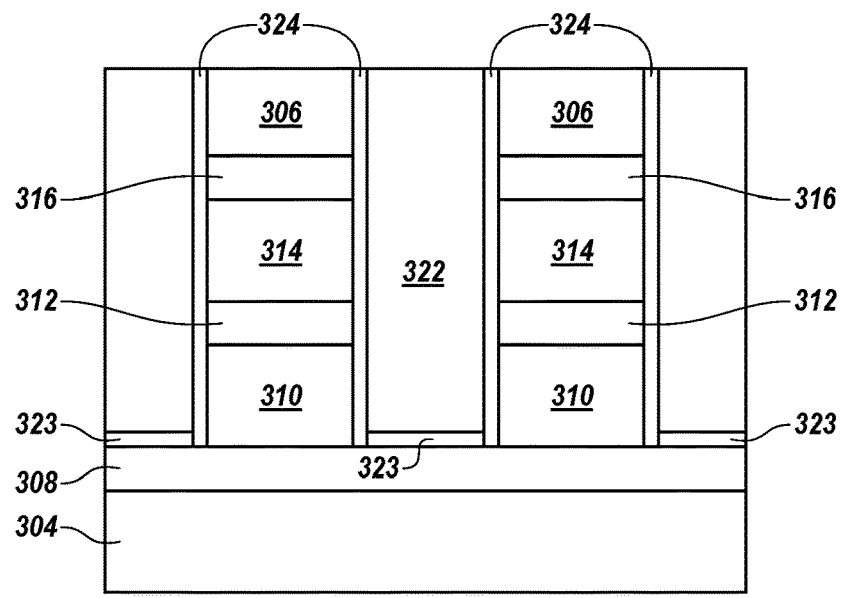

FIGS. 3A and 3B illustrate cross-sectional views of memory cells in perpendicular directions in accordance with a number of embodiments of the present disclosure. FIG. 3A shows a cross-section in a first direction, e.g., side view, of a portion of a memory array, such as that shown in FIG. 1. FIG. 3B shows a cross-section in a second direction, e.g., end view, of a portion of a memory array, such as that shown in FIG. 1. FIGS. 3A and 3B show some additional detail than that shown and described with respect to FIG. 1. The memory cells shown in FIGS. 3A and 3B can be similar to those described with respect to FIGS. 1 and 2.

As shown in FIG. 3A, a stack of materials can be formed over a word line 304. For example, the stack of materials can include a third electrode 308 formed over the word line 304, a switch element 310 formed over the third electrode 308, a second electrode 312 formed over the switch element 310, a memory element 314 formed over the second electrode 312, and a first electrode 316 formed over the memory element 314. A bit line 306 can be formed over the stack extending left-to-right in FIG. 3A and into-and-out-of the paper in FIG. 3B. Word line 304 extends perpendicularly to bit line 306. That is, word line 304 extends into-and-out-of the paper in FIG. 3A and left-to-right in FIG. 3B. Likewise, the third electrode 308 can extend similarly to the word line 304, as shown in FIGS. 3A and 3B.

For simplicity, all the components of the stack are shown having similar measurements in each of several directions. However, according to embodiments disclosed herein, the memory element 314 and switch element 310 can have one or more different directions from one another and/or electrode(s). In FIGS. 3A and 3B, the stack of materials is shown being square when viewed from the side and end perspectives.

As shown in FIG. 3A, sealing material 321 can be formed around the word line stacks and filling material 320 can be formed in the areas between the word line stacks. A dielectric material 322 can be formed over sealing material 321 and filling material 320 in the areas between the word line stacks, as shown in FIG. 3A.

As shown in FIG. 3B, sealing material 324 can be formed around the bit line stacks and filling material 323 can be formed in the areas between the bit line stacks. Dielectric material 322 can be formed over sealing material 324 and filling material 323 in the areas between the bit line stacks, as shown in FIG. 3B.

The cross point array 100 of memory cells shown in FIGS. 1 and 2 can be created through dry etch patterning in two perpendicular directions, e.g., corresponding to the direction of the word lines 304 and the bit lines 306. Materials corresponding to respective conductive lines and components of the memory cell can be bulk deposited and etched to form the various features. The dry etch patterning in two perpendicular directions forms the various conductive lines and the stacks corresponding to individual memory cells. For example, a first etch can define one direction of the stack, e.g., a row structure separated by first trenches, self-aligned to the underlying conductive lines, e.g., word lines 304, which in turn can be connected to other circuitry.

As shown in FIG. 3A and described above, the row structures and trenches can be sealed in between the word line 304, e.g., with sealing material 321, and filled with filling material 320 and dielectric material 322. Subsequently, a material comprising the bit lines 306, e.g., conductive material, can be deposited on top of the row structures, sealing material 321, filling material 320, and dielectric material 322. A second etch process can be used to form second trenches that define the bit lines 306 in a direction perpendicular to the word lines 304, and again self-aligned to the stacks associated with the memory cells (down to the third electrodes 308). Thereafter, the second trenches and third electrodes 308 can be sealed, e.g., by sealing materials 324 and filling material 323, and the second trenches filled by dielectric material 322. The result of the above-described sequence is an array of stacks, e.g., active pillars, corresponding to respective memory cells and isolated from one another by dielectric material 322. Word lines 304 below the memory cells connect the stacks in one direction, and bit lines 306 above the memory cells connect the stacks in a perpendicular direction.

FIGS. 4A and 4B illustrate cross-sectional views in a same cross section of different sized stacks corresponding to a memory cell in accordance with a number of embodiments of the present disclosure. That is, FIGS. 4A and 4B show the same cross section before (FIG. 4A) and after (FIG. 4B) a dimension modification, e.g., isotropic etch. The respective stacks shown in FIGS. 4A and 4B can be formed by dry etch patterning in two perpendicular directions described above with respect to FIGS. 3A and 3B. For example, dry etching can be used to form the stacks corresponding to individual memory cells. As will be further described according to embodiments herein, dry etching can be used to control the various dimensions of the stack, e.g., width and length of a cross-sectional area of the switch and memory elements, in a plane perpendicular to a direction between the switch element and the memory element.

For example in FIG. 4A, the dry etch patterning in two perpendicular directions can be used to form a relatively wider stack (comprising word line 404A, third electrode 408A, switch element 410A, second electrode 412A, memory element 414A, and first electrode 416A). In FIG. 4B, a relatively thinner stack (comprising word line 404B, third electrode 408B, switch element 410B, second electrode 412B, memory element 414B, and first electrode 416B). Because the dry etch patterning in two perpendicular directions is self-aligning, all of the components of the relatively wider stack, shown in FIG. 4A, have the same dimensions. Further, all of the components are wider than all of the components of the relatively thinner stack shown in FIG. 4B. That is, using the dry etch patterning in two perpendicular directions to control width of the memory element, for example, results in the widths of all other components in the stack being likewise controlled to the same width.

During the dry etch patterning in two perpendicular directions to form stacks corresponding to memory cells, it is beneficial to have a constant vertical etch profile so as to better define bottom components. This ensures proper isolation throughout the stack (particularly for bottom components), and avoids worsening aspect ratios.

Critical dimension (CD) is the finest line resolvable associated with etch patterning, e.g., etching using a pattern to delineate areas to be etched from areas not to be etched. As used herein, lateral dimension (LD) is a dimension in a plane that is perpendicular to a direction between the switch element and a corresponding memory element of a memory cell, e.g., perpendicular to the orientation of the stack of materials comprising the memory cell. The LD can be a CD (discussed above) or a modified dimension (discussed below). For example, a stack can have a rectangular volume.

The rectangular volume can have a longest dimension in a direction the switch element and the corresponding memory element.

Modified dimension (MD) is a lateral dimension of a memory cell stack that has been modified from those dimensions achieved by etch patterning, e.g., such as by an additional isotropic etch. For example, MD can be a desired design rule implementation dimension. Smallest lateral dimension is a stack component, e.g., memory element, select element, etc., dimension other than length, e.g., width, depth, having the least magnitude, where length is oriented in the direction between memory element and select element.

For dry etch patterning in two perpendicular directions, the word line CD can be defined by lithography or pitch multiplication, hard mask, and dry etch, mainly during a first part of the process through hard masking. According to various embodiments of the present disclosure, and as described below, the MD can be further defined from a CD by additional selective etching, e.g., isotropic etching.

The lateral dimension, e.g., CD, of the relatively wider stack shown in FIG. 4A is greater than the lateral dimension, e.g., CD, of the relatively thinner stack shown in FIG. 4B. However, the LD of the memory element 414A is the same as the LD of the switch element 410A, in the stack shown in FIG. 4A. The LD of the memory element 414B is the same as the LD of the switch element 410B in the stack shown in FIG. 4B. That is, the ratio of LD of the memory element to LD of the switch element, e.g., LD(ME)/LD(SE), is 1 for the stacks shown in FIGS. 4A and 4B. Electrical performance of a memory cell is related to the LD and profile of the memory elements 414A/B and switch elements 410A/B. Therefore, the electrical performance of the memory elements 414A/B and switch elements 410A/B is not independent in the stacks shown in FIGS. 4A and 4B.

FIGS. 5A and 5B illustrate cross-sectional views of stacks corresponding to a memory cell having different sized memory elements in accordance with a number of embodiments of the present disclosure. FIGS. 5A and 5B illustrate a configuration and method by which the LD of the memory element and the LD of the switch element can be independent. Functionality of a memory cell can be modulated by controlling the dimension(s), e.g., LD, of the memory element with respect to the dimension(s), e.g., LD, of the switch element. Where the dimension(s) of the memory element are not independent of the dimension(s) of the switch element, increasing the current density in the memory element by decreasing the dimension(s) of the memory element causes the current density to correspondingly increase by the same amount in the switch element. This can be detrimental to the functional characteristics of the switch element. That is, improving the operability of the memory element may decrease the operability of the switch element where the dimension(s) of the memory element are not independent of the dimension(s) of the switch element.

FIG. 5A shows a stack formed by having word line 504, third electrode 508, switch element 510, second electrode 512, memory element 514A, and first electrode 516. FIG. 5B shows a stack formed by having word line 504, third electrode 508, switch element 510, second electrode 512, memory element 514B, and first electrode 516. As shown in FIG. 5A, memory element 514A is relatively wider than memory element 514B shown in FIG. 5B. All other stack components are substantially the same size in the stacks of FIGS. 5A and 5B.

According to various embodiments, the stack shown in FIG. 5B can be formed from the stack shown in FIG. 5A. To form the stack shown in FIG. 5B, the stack shown in FIG. 5A can be subjected to a selective/isotropic process, which is step able to etch the memory element selectively with respect to other materials in a non-directional manner, e.g., selective to a particular material such as that from which the memory element is formed more than other materials and isotropic such that etching can have a horizontal effect. As shown, an isotropic dry etch that is able to selectively etch the memory element material can recess the memory element sidewalls without affecting the other exposed stack component materials. The selective/isotropic process includes an etch with an isotropic component (but does not necessarily intend that the etch be 100% isotropic). Also, selectivity need not be 100% selective to the intended particular material and completely exclude all other materials. For example, the same chemistry can have different etch rates for PCM and OTS material, neither of which may be null.

After the selective etch, e.g., selective isotropic dry etch to the memory element material with respect to other materials, the memory element sidewalls 513 shown in FIG. 5B are recessed with respect to other portions of the stack, e.g., relative to word line 504, relative to switch element 510, relative to an electrode, etc. Since the resulting lateral dimension of the memory element 514B is less than the lateral dimension of the switch element 510 (switch element dimension did not change by the selective isotropic dry etch that is selective to the memory element material), LD(ME)/LD(E)<1.

Although FIG. 5A shows a complete stack is formed, which might then be subjected to an etch selective to the memory element material, e.g., selective isotropic dry etch to a particular component material with respect to other materials, according to various embodiments of the present disclosure, the selective etch, e.g., selective to the memory element material with respect to other materials, can be implemented after directional etching of the memory element, but before directional etching of the underlying component, e.g., second electrode 512. Therefore, another example dry etching sequence to accomplish a memory element of reduced dimension relative to other stack components, and/or word line 504 width, can be:

1. Directional etch first electrode 516
2. Directional etch memory element 514A
3. Selective etch able to etch the memory element 514A selective with respect to other materials)
4. Directional etch second electrode 512
5. Directional etch switch element 510
6. Directional etch third electrode 508
7. Directional etch word line 504

The selective etch step can alternatively be performed at other times during the process, e.g., after the directional etch of word line 504, since the etch is performed to etch the memory element and to avoid etching materials other than the memory element material. The amount of reduction in a lateral dimension of the material removed by the selective isotropic dry etch can be controlled, for example, by the duration of the selective isotropic dry etch, among others. With the ability to independently adjust dimension(s) of one stack component, e.g., memory element 514A lateral dimension relative to switch element 510 lateral dimensions, electrical characteristics of the stack, e.g., current density in memory element 514B and switch element 510 can be independently controlled to improve operating characteristics.

According to a number of embodiments of the present disclosure, the selective isotropic dry etch can have a same chemistry as the directional etch for a particular material, e.g., memory element material. However, the etch conditions can be altered to achieve an isotropic etch. For example, a directional etch of the memory element 514A can be implemented with a strong plasma, whereas the selective isotropic dry etch can use the same chemistry but different plasma conditions such as different pressure and/or by changing the (ion) bias voltage. According to a number of embodiments, the bias voltage (Vb) of a conductor dry etching chamber can be turned off with the pressure set to be higher relative to the directional etch bias voltage. As a result, ions in the plasma may be less accelerated to a surface of an in-situ wafer which is being processed in the etching chamber, e.g., upon which the stack is formed. Thus, there may be little, if any, bombardment on exposed surface layers. Hence, the plasma-wafer interaction is chemical rather than physical.

According to some embodiments, a gas mixture including hydrogen-based components can be used for the step able to etch the memory element material selectively with respect to other materials, e.g., selective isotropic dry etch where the gas mixture is selective to etch the memory element material more than other materials. Further, an X-based gas mixture can be used for the step able to etch the switch element material selectively with respect to other materials, e.g., selective isotropic dry etch where the gas mixture is selective to etch the switch element material more than other materials. In this example, X can be one or more of fluorine (F), chlorine (Cl) or bromine (Br). Other isotropic etch processes can be used under certain circumstances such as a wet etch, e.g., where other stack components that may be affected are not yet exposed by a directional dry etch.

FIGS. 6A and 6B illustrate cross-sectional views of stacks corresponding to a memory cell having different sized switch elements in accordance with a number of embodiments of the present disclosure. FIGS. 6A and 6B also illustrate a configuration and method by which the LD of the memory element and the LD of the switch element can be independent by changing the dimension(s) of a switch element relative to a memory element.

FIG. 6A shows a stack formed by having a word line 604, third electrode 608, switch element 610A, second electrode 612, memory element 614, and first electrode 616. FIG. 6B shows a stack formed by having word line 604, third electrode 608, switch element 610B, second electrode 612, memory element 614, and first electrode 616. As shown in FIG. 6A, switch element 610A in the stack is relatively wider than switch element 610B shown in the stack of FIG. 6B. In this example embodiment, all other stack components can be substantially the same size between the stacks shown in FIGS. 6A and 6B.

According to various embodiments, the stack shown in FIG. 6B can be formed from the stack shown in FIG. 6A. To form the stack shown in FIG. 6B, the stack shown in FIG. 6A can be subjected to a step able to etch the memory element material selectively to other materials, e.g., selective isotropic dry etch selective to etch a particular material such as that from which the memory element is formed more than other materials and isotropic such that etching can have a horizontal etching effect on the switch element 610A. As shown, an etch selective to the switch element material with respect to other materials can recess the switch element sidewalls without affecting the other exposed stack component materials, including the memory element.

After the selective etch, e.g., selective dry etch to etch the switch element material more than other materials, the switch element sidewalls 615 shown in FIG. 6B are recessed with respect to other portions of the stack, e.g., relative to word line 604, relative to memory element 614, relative to an electrode, etc. Since the resulting lateral dimension of the switch element 610B is less than the lateral dimension of the memory element 614 (memory element dimension did not change by the selective isotropic dry etch that is selective to the switch element material), LD(ME)/LD(E)>1.

Although FIG. 6A shows a complete stack is first formed, which might then be subjected to a selective isotropic dry etch (selective to a particular component material), according to various embodiments of the present disclosure, the step able to etch the switch element material selectively to other materials, e.g., selective dry etch that etches the switch element material more than other materials, can be implemented after directional etching of the switch element 610A, but before directional etching of the underlying component, e.g., third electrode 608. Therefore, another example dry etching sequence to accomplish a switch element of reduced dimension relative to other stack components, and/or word line 604 width, can be:

1. Directional etch first electrode 616
2. Directional etch memory element 614
3. Directional etch second electrode 612
4. Directional etch switch element 610A
5. Selective etch able to etch the switch element 610A selective to other materials.
6. Directional etch third electrode 608
7. Directional etch word line 604

The selective etch step can alternatively be performed at other times during the process, e.g., after the directional etch of word line 610A, since the etch is performed to etch the switch element material and to avoid etching materials other than the switch element material. The amount of reduction in a lateral dimension of the material removed by the selective isotropic dry etch can be controlled, for example, by the duration of the selective isotropic dry etch, among others. With the ability to independently adjust dimension(s) of another stack component, e.g., switch element 610A lateral dimension relative to select element 510 lateral dimensions, electrical characteristics of the stack, e.g., current density in memory element 614 and switch element 610B can further be independently controlled to improve operating characteristics.

According to a number of embodiments of the present disclosure, the selective isotropic dry etch can be similar to that described above with respect to the memory element 514A shown in FIG. 5A, except instead being selective to the switch element 610A material. In this manner, it is possible to modulate the switch element 610B lateral dimension(s) as desired relative to lateral dimension(s) of other stack components, e.g., memory element 614 and/or electrode(s) and/or word line 604. Considering the directional and selective isotropic dry etches, stack component dimension(s), including critical dimension and/or area in a plane perpendicular to the stack orientation, can be controlled in one or more of the following ways:

1. Reduce lateral dimension(s) of all components of the entire stack (including both memory element and switch element) by directional dry etch, e.g., via lithography or pitch multiplication and hard mask etch process.
2. Reduce the lateral dimension(s) of only the memory element via a selective isotropic dry etch (selective to memory element material).
3. Reduce the lateral dimension(s) of only the switch element via a selective isotropic dry etch (selective to switch element material).

Reduction of lateral dimensions of components in the stack can be implemented on walls of a stack, e.g., stack walls having a direction parallel to edges of the word line and/or stack walls having a direction parallel to edges of the word line. For example, the reduction can be applied to walls along a single direction or along multiple, e.g., perpendicular, directions, as discussed further below. Stack component lateral dimension(s) can be relatively increased, for example, by increasing the lateral dimension(s) of the entire stack and selectively reducing lateral dimension(s) of certain components, thus leaving lateral dimension(s) of other stack components relatively wider.

FIGS. 7A and 7B illustrate cross-sectional views of stacks corresponding to a memory cell having different sized memory and switch elements in accordance with a number of embodiments of the present disclosure. FIGS. 7A and 7B illustrate a combined configuration and method by which the lateral dimension(s), e.g., CD, of the memory element and the lateral dimension(s), e.g., CD, of the switch element can be independent. According to this example embodiment the lateral dimension(s) of both a switch element and a memory element can be changed relative to other stack components, e.g., electrodes, word line, bit line, etc. Furthermore, the lateral dimension(s) of the switch element and memory element can both be reduced by a same, or different, amount relative to one another.

FIG. 7A shows a stack formed by having a word line 704, third electrode 708, switch element 710A, second electrode 712, memory element 714A, and first electrode 716. FIG. 7B shows a stack formed by having a word line 704, third electrode 708, switch element 710B, second electrode 712, memory element 714B, and first electrode 716. As shown in FIG. 7A, switch element 710A is relatively wider than switch element 710B shown in FIG. 7B. Memory element 714A shown in FIG. 7A is relatively wider than memory element 714B shown in FIG. 7B. Furthermore, FIG. 7B also shows that memory element 714B is thinner relative to switch element 710B. Although, FIG. 7B shows memory element 714B being reduced by an amount such that it is thinner relative to switch element 710B, according to other embodiments switch element 710B can be reduced by an amount such that the switch element 710B has the same dimension(s) as the memory element 714B, or is thinner relative to memory element 714B. In this example embodiment, all other stack components can be substantially the same size between the stacks shown in FIGS. 7A and 7B.

According to various embodiments, the stack shown in FIG. 7B can be formed from the stack shown in FIG. 7A. To form the stack shown in FIG. 7B, the stack shown in FIG. 7A can be subjected to a plurality of selective isotropic dry etches, e.g., reach selective to a different material) so as to recess the material of the selected stack component without affecting the other exposed stack component materials.

After a step able to etch the switch element material selectively to other materials, e.g., selective dry etch to etch the switch element material more than other materials, and after a step able to etch the memory element material selectively to other materials, e.g., selective isotropic dry etch to etch the memory element material more than other materials, the memory element sidewalls 717 and switch element sidewalls 719 are both recessed with respect to other portions of the stack, e.g., relative to word line 704, relative to an electrode, etc. Also the resulting lateral dimension of the memory element is less than the lateral dimension of the switch element, LD(ME)/LD(SE)<1. According to various other embodiments, the resulting lateral dimension of the memory element is greater than the lateral dimension of the switch element such that LD(ME)/LD(SE)>1.

As discussed with respect to FIGS. 5A, 5B, 6A, and 6B, although a completely formed stack is shown in FIG. 7A, which can be subjected to a plurality of selective isotropic dry etches, e.g., one selective to memory element material and one selective to switch element material, according to various embodiments of the present disclosure, the selective isotropic dry etches can be implemented respectively after directional etching of the particular stack component to be subjected to a selective isotropic dry etch, but before directional etching of the underlying stack component. Therefore, another example dry etching sequence that can be used to accomplish the result shown by the stack shown in FIG. 7B can be:

1. Directional etch first electrode 716
2. Directional etch memory element 714A
3. Selective etch able to etch the memory element 714A selective to other materials
4. Directional etch second electrode 712
5. Directional etch switch element 710A
6. Selective able to etch the switch element 710A selective to other materials
7. Directional etch third electrode 708
8. Directional etch word line 704

The respective selective etch steps can alternatively be performed in an order other than that shown in the process above. The amount of reduction in a lateral dimension of the material removed by a particular selective isotropic dry etch can be controlled, for example, by the duration of the particular selective isotropic dry etch. Respective selective isotropic dry etches can have different durations, for example, so as to independently control amounts of the selected material to be removed thereby.

FIGS. 8A and 8B illustrate cross-sectional views of stacks corresponding to a memory cell having non-vertical stack wall and different sized switch elements in accordance with a number of embodiments of the present disclosure. For any number of reasons, stack walls may not be formed to be completely vertical. FIGS. 8A and 8B show that the selective isotropic dry etch techniques described above can be applied to components of a stack having non-vertical stack wall to compensate for the different component dimensions that can result when the stack walls are not completely vertical.

That is, one or more selective isotropic dry etch can be used to modulate the stack sidewall slope, e.g., the memory element and/or switch element portions of the stack. Improving the verticality of a stack sidewall initially having a tapered profile can improve the verticality of the word line and/or bit line as well. Generally, better stack sidewall verticality facilitates better etching performance for memory cells with a large aspect ratio, and can reduce the risk of bit line-to-bit line leakage, as well.

FIG. 8A shows a stack formed by having word line 804, third electrode 808, switch element 810A, second electrode 812, memory element 814, and first electrode 816. FIG. 8B shows a stack formed by having a word line 804, third electrode 808, switch element 810B, second electrode 812, memory element 814, and first electrode 816. Similar to that shown and described with respect to FIGS. 6A and 6B, the dimension(s) of switch element 810A in the stack shown in FIG. 8A can be reduced to the result shown for switch element 810B in the stack of FIG. 8B by a selective isotropic dry etch.

The switch element 810B in the stack shown in FIG. 8B is shown being reduced in lateral dimension(s) to those of the memory element 814. Current density through a particular stack component, e.g., memory element, switch element, is determined by the area of the component through which current can flow. As such, the memory element 814 in the stack shown in FIG. 8A can have a higher current density than the switch element 810A since the lateral dimension(s) of the memory element 814 (and thus the area bounded by the lateral dimension(s)) are less than the lateral dimension(s) of the switch element 810A. After a selective isotropic dry etch is used to reduce lateral dimension(s) of switch element 810A, as shown in the stack of FIG. 8B, switch element 810B is now the same size as memory element 814. Therefore, current densities can be made similar, e.g., brought back to an intended proportionality associated with vertical stack sidewall.

Some additional benefits can be realized from the memory cell configurations and methods for achieving same than those previously discussed including word line and/or bit line cleaning. A selective isotropic dry etch process can help in removing resputtered polymers, e.g., directional dry etch by-products, from the stack sidewalls corresponding to the word line and/or bit line respectively. Often the polymers on the stack sidewalls can induce a high vertical leakage in an array having such memory cells if not completely removed by wet cleaning. According to some embodiments, the selective isotropic dry etch process described herein can function to clean the stack sidewalls from even very low volatile polymers.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell comprising:
   a chalcogenide switch element;
   a memory element formed in series with the chalcogenide switch element; and
   a first electrode between and in physical contact with the chalcogenide switch element and the memory element, wherein the first electrode comprises a single material;
   wherein the chalcogenide switch element comprises inwardly etched sidewalls relative to etched sidewalls of the first electrode;
   wherein the memory element comprises inwardly etched sidewalls relative to the etched sidewalls of the first electrode;
   wherein a lateral dimension between the inwardly etched sidewalls of the chalcogenide switch element and a lateral dimension between the inwardly etched sidewalls of the memory element are such that a smallest lateral dimension between the inwardly etched sidewalls of the chalcogenide switch element is different than a smallest lateral dimension between the inwardly etched sidewalls of the memory element, and
   wherein the smallest lateral dimension between the inwardly etched sidewalls of the chalcogenide switch element and the smallest lateral dimension between the inwardly etched sidewalls of the memory element are less than a smallest lateral dimension between the etched sidewalls of the first electrode.

2. The memory cell of claim 1, wherein the smallest lateral dimension between the inwardly etched sidewalls of the chalcogenide switch element is greater than the smallest lateral dimension between the inwardly etched sidewalls of the memory element.

3. The memory cell of claim 1, wherein the chalcogenide switch element, the memory element, and the first electrode are arranged in a stack.

4. The memory cell of claim 1, further comprising a second electrode formed between and in contact with a word line and the chalcogenide switch element and a third electrode formed in contact with the memory element.

5. A memory cell comprising:
   a chalcogenide switch element;
   a memory element formed in series with the chalcogenide switch element; and
   a first electrode between the chalcogenide switch element and the memory element,
   wherein the chalcogenide switch element comprises inwardly etched sidewalls relative to etched sidewalls of the first electrode; and
   wherein the memory element comprises inwardly etched sidewalls relative to the etched sidewalls of the first electrode;
   wherein a smallest lateral dimension between the inwardly etched sidewalls of the chalcogenide switch element and a smallest lateral dimension between the inwardly etched sidewalls of the memory element are less than a smallest lateral dimension between the etched sidewalls of the first electrode, and
   wherein the chalcogenide switch element and the memory element are in a same memory cell.

6. The memory cell of claim 5, wherein the chalcogenide switch element, the memory element, and the first electrode are arranged in a stack.

7. The memory cell of claim 5, wherein the smallest lateral dimension between the inwardly etched sidewalls of the chalcogenide switch element is different than the smallest lateral dimension between the inwardly etched sidewalls of the the memory element.

8. The memory cell of claim 5, wherein the chalcogenide switch element and the memory element are arranged in a stack, and wherein a cross-sectional area of the chalcogenide switch element in a plane perpendicular to a stack length is greater than a cross-sectional area of the memory element in the plane perpendicular to the stack length.

9. A memory cell comprising:
a chalcogenide switch element arranged in a stack;
a chalcogenide memory element formed in series with the chalcogenide switch element; and
a first electrode between and in contact with the chalcogenide switch element and the chalcogenide memory element, wherein the first electrode comprises a single material;
wherein the chalcogenide switch element comprises inwardly etched sidewalls relative to etched sidewalls of the first electrode;
wherein the chalcogenide switch element comprises a single material;
wherein the chalcogenide memory element comprises inwardly etched sidewalls relative to the etched sidewalls of the first electrode;
wherein a lateral dimension between the inwardly etched sidewalls of the chalcogenide switch element and a lateral dimension between the inwardly etched sidewalls of the chalcogenide memory element are such that a smallest lateral dimension between the inwardly etched sidewalls of the chalcogenide switch element is different than a smallest lateral dimension between the inwardly etched sidewalls of the chalcogenide memory element, and
wherein the smallest lateral dimension between the inwardly etched sidewalls of the chalcogenide switch element and the smallest lateral dimension between the inwardly etched sidewalls of the chalcogenide memory element are less than a smallest lateral dimension between the etched sidewalls of the first electrode, and
wherein the chalcogenide switch element and the chalcogenide memory element are in a same memory cell.

10. The memory cell of claim 9, wherein the smallest lateral dimension between the inwardly etched sidewalls of the chalcogenide switch element is greater than the smallest lateral dimension between the inwardly etched sidewalls of the chalcogenide memory element.

11. The memory cell of claim 9, wherein a cross-sectional area of the chalcogenide switch element in a plane perpendicular to a stack length is less than a cross-sectional area of the first electrode in the plane perpendicular to the stack length.

* * * * *